(12) United States Patent
Murdoch

(10) Patent No.: US 8,417,195 B2
(45) Date of Patent: Apr. 9, 2013

(54) METHOD AND APPARATUS ADAPTED TO TRANSMIT DATA

(75) Inventor: Graham Alexander Munro Murdoch, Woolstonecraft (AU)

(73) Assignee: Magellan Technology PTY Limited, Annandale, New South Wales (AU)

( * ) Notice: Subject to any disclaimer, the term of this patent is extended or adjusted under 35 U.S.C. 154(b) by 0 days.

(21) Appl. No.: 12/066,355

(22) PCT Filed: Sep. 8, 2006

(86) PCT No.: PCT/AU2006/001321
§ 371 (c)(1),
(2), (4) Date: Jun. 10, 2008

(87) PCT Pub. No.: WO2007/030864
PCT Pub. Date: Mar. 22, 2007

(65) Prior Publication Data
US 2009/0010360 A1    Jan. 8, 2009

(30) Foreign Application Priority Data
Sep. 12, 2005    (AU) ............................... 2005904985

(51) Int. Cl.
*H04B 1/04* (2006.01)
(52) U.S. Cl. .............. 455/120; 455/77; 455/87; 455/91; 455/102; 375/296; 375/297; 375/300
(58) Field of Classification Search ................. 455/424, 455/425, 456.5, 456.6, 561, 550.1, 575.1, 455/110, 107, 77, 87, 91, 102, 108, 114.3, 455/115.1, 120, 125; 375/244, 280, 283, 375/238, 324, 296, 297, 300
See application file for complete search history.

(56) References Cited

U.S. PATENT DOCUMENTS

| 4,174,505 | A | * | 11/1979 | Querry ........................ 375/283 |
| 4,417,219 | A | * | 11/1983 | Brossard et al. .............. 332/104 |
| 4,562,415 | A | * | 12/1985 | McBiles ...................... 332/104 |
| 4,575,858 | A | * | 3/1986 | Dow ............................ 375/280 |
| 4,706,261 | A | * | 11/1987 | Torre et al. ................... 375/244 |
| 4,726,038 | A | * | 2/1988 | Ikegami et al. ............... 375/280 |
| 4,841,547 | A | * | 6/1989 | Ikegami et al. ............... 375/280 |

(Continued)

FOREIGN PATENT DOCUMENTS

| CA | 1340489 | 4/1999 |
| EP | 0608966 | 3/1999 |
| SU | 896747 | 1/1982 |
| WO | WO-99/034526 | 7/1999 |

OTHER PUBLICATIONS

Siver, Dale, International Search Report; Oct. 31, 2006 (4 pages).

*Primary Examiner* — Tuan Pham
(74) *Attorney, Agent, or Firm* — Winstead PC

(57) ABSTRACT

The present invention relates to the field of data transmission. The invention has application to amplifiers, the transmission of data modulated signals, filters and/or matching circuits connected between an amplifier and a load, radio transmitters, the transmission of data modulated radio signals, filters and/or matching circuits used between a transmitter's power amplifier and an antenna and the field of Radio Frequency Identification (RFID), such as in the transmission of data between a tag and an interrogator. The present invention enables the transmission of phase modulated signals, by adjusting a device's tuning to substantially match the instantaneous frequency of the phase modulated signal.

21 Claims, 10 Drawing Sheets

Tuned Frequency

| Switch | $f_c - \Delta f_c$ | $f_c$ | $f_c + \Delta f_c$ |
|---|---|---|---|
| A | close | close | open |
| B | close | open | open |

U.S. PATENT DOCUMENTS

| | | |
|---|---|---|
| 5,056,122 A * | 10/1991 | Price .................... 375/324 |
| 5,182,749 A * | 1/1993 | Kazecki et al. ............ 370/498 |
| 5,193,222 A * | 3/1993 | Sasaki .................... 455/102 |
| 5,446,760 A * | 8/1995 | Bienz et al. ............... 375/295 |
| 6,005,638 A | 12/1999 | Blair et al. |
| 6,034,603 A | 3/2000 | Steeves |
| 6,061,475 A | 5/2000 | Blair |
| 6,172,732 B1 * | 1/2001 | Hayakawa et al. ........ 349/152 |
| 6,193,394 B1 * | 2/2001 | Herst et al. ............... 362/260 |
| 6,294,953 B1 | 9/2001 | Steeves |
| 6,452,547 B1 * | 9/2002 | Johannessen ............. 342/388 |
| 6,564,744 B2 * | 5/2003 | Nakahigashi et al. .... 118/723 E |
| 6,570,487 B1 | 5/2003 | Steeves |
| 6,766,150 B1 | 7/2004 | Johnson |
| 6,775,324 B1 * | 8/2004 | Mohan et al. ............. 375/238 |
| 6,784,785 B1 | 8/2004 | Wuidart |
| 6,954,859 B1 | 10/2005 | Simerly et al. |
| 7,005,985 B1 | 2/2006 | Steeves |
| 7,271,727 B2 | 9/2007 | Steeves |
| 7,286,158 B1 | 10/2007 | Griebenow |
| 7,449,945 B2 * | 11/2008 | Kawakubo et al. ........ 329/345 |
| 2002/0163962 A1 | 11/2002 | Al-Eidan |
| 2004/0257220 A1 * | 12/2004 | Fischer et al. ............. 340/531 |
| 2006/0066444 A1 | 3/2006 | Steeves |
| 2006/0071756 A1 | 4/2006 | Steeves |
| 2007/0159338 A1 | 7/2007 | Beber et al. |
| 2007/0205896 A1 | 9/2007 | Beber et al. |
| 2007/0285241 A1 | 12/2007 | Griebenow et al. |
| 2008/0042850 A1 | 2/2008 | De Witte et al. |

* cited by examiner

Frequency response for antenna $$BW = \frac{F_o}{Q}$$

Typically $Q = 70$
$BW = 190\text{KHz}$
for $F_o = 13.56\text{MHz}$

PJM spectrum for 424 kbit/sec data rate

Figure 4
Phase modulation of carrier fc
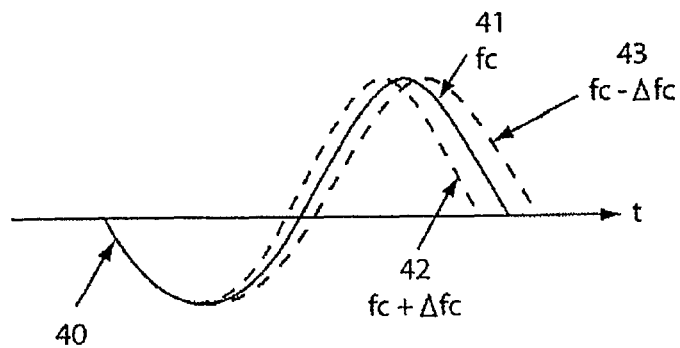
Figure 5a
Phase of PJM transmission
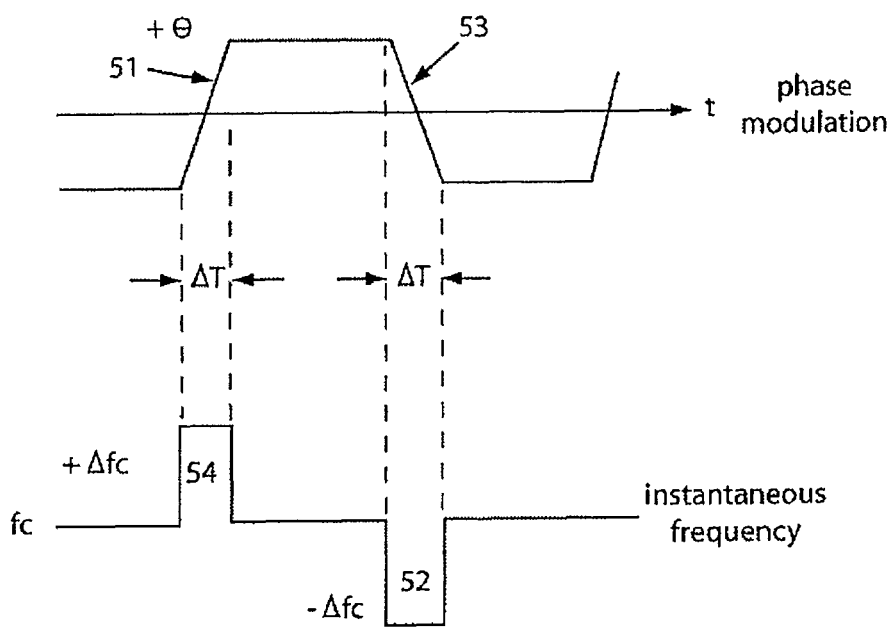
Figure 5b
Instantaneous frequency of PJM transmission Basic circuit showing invention Switch closure relationships of the circuit shown in Figure 6

Embodiment of invention

Alternative embodiment where switches are DC isolated from the resonant antenna or load Alternate embodiment where switches are isolated through transformers A further alternate embodiment where switches are isolated through transformers Example circuits of Figure 10a Another example circuit of Figure 10a Alternative embodiment where a variable duty cycle switched reactance creates a variable reactance Multi-level signalling by using additional switches Frequency and data waveforms associated with Figure 12a Multi-level signalling by using extending period of switch closure / opening Frequency and data waveforms associated with Figure 13a

METHOD AND APPARATUS ADAPTED TO TRANSMIT DATA

FIELD OF INVENTION

The present invention relates to the field of data transmission.

In one form, the invention relates to amplifiers and the transmission of data modulated signals.

In another form, the invention relates to the filters and/or matching circuits connected between the amplifier and load and their ability to pass modulated signals.

In another form, the invention relates to radio transmitters and the transmission of data modulated radio signals.

In another form, the invention relates to the filters and/or matching circuits used between the transmitter's power amplifier and antenna and their ability to pass modulated signals In another form, the invention relates to the field of Radio Frequency Identification (RFID), and the transmission of data from a tag to an interrogator.

In another form, the present invention is suitable for transmitting data via a single antenna.

It will be convenient to hereinafter describe the invention in relation to transmission between a RFID tag and an interrogator, however it should be appreciated that the present invention is not limited to that use only.

BACKGROUND ART

The discussion throughout this specification comes about due to the realisation of the inventors and/or the identification of certain prior art problems by the inventors.

There are many applications where modulated sine waves are passed through frequency selective circuits. Transmitters are one example where data modulated carriers are passed through filters and matching circuits before being transmitted by an antenna. These filter and matching circuits are often narrowband high Q in order to achieve good transmitter efficiency. High Q circuits however are not able to pass data modulated sine waves where the data rate is higher then the circuit bandwidth.

The inventors have realised that in the past, data has been transmitted to RFID tags by modulation of the excitation field. Generally pulse position modulation (PPM) is used, where 100% depth amplitude modulation of the interrogation field is used. The interrogation field is turned off for short pulse periods and this is detected by the tag's processing circuitry.

The inventors have realised that to achieve high data rates whilst maintaining the transmission of power, these pulses must be short and the duty cycle must be low. Typically a duty cycle of approximately 10% is used where the pulses are 9 μs long and the average time between pulses is around 75 μs.

Short pulses such as these have a bandwidth much wider than the original data bandwidth. Accordingly, to pass the inherently broad band of the PPM interrogation signal, both the interrogator and tag antenna must have a bandwidth significantly wider than the original data bandwidth. Consequently the interrogator and the tag antennae must have a relatively low Q factor to transmit and receive the data. However, antennas with a low Q factor are relatively inefficient and will operate with an efficiency lower than would otherwise be required for practical commercial applications of this technology as only low data rates are possible.

The inventors have further realised that additionally, PPM produces relatively high level modulation product side bands. For passive tags, a stronger excitation field is required to compensate for a less efficient antenna. Emission regulations must also be kept in mind and these place restrictions on side band transmissions including modulation products that can be transmitted. This places restrictions on the maximum excitation field strength that can be used. In order to reduce the sideband levels the modulation depth can be reduced. Modulation depths of between 10% and 30% have been proposed. An example of such systems is provided by ISO14443 an internationally recognised RFID system.

For these small modulation depths the tag voltage regulation circuits connected to the tag antenna will reduce the amplitude detected by the tag through the effect of amplitude compression. The stronger the interrogation field the greater the level of amplitude compression. However, amplitude compression of the PPM signal leads to a much reduced operating range for systems using PPM.

Any discussion of documents, devices, acts or knowledge in this specification is included to explain the context of the invention. It should not be taken as an admission that any of the material forms a part of the prior art base or the common general knowledge in the relevant art in Australia or elsewhere on or before the priority date of the disclosure and claims herein.

An object of the present invention is to provide an improved data transmission method and apparatus.

A further object of the present invention is to alleviate at least one disadvantage associated with the prior art.

SUMMARY OF INVENTION

The present invention relates to the field of data transmission and in particular where data is phase modulated onto a signal. It has application where phase modulated signals are passed through frequency selective circuits. These circuits are often inherently narrow band and can not pass signals which are modulated at data rates greater than the circuit's bandwidth. The present invention allows phase modulated signals to pass through frequency selective circuits where the circuit's bandwidth is smaller than the data rate of the phase modulated signal.

In a preferred form, the invention relates to amplifiers and the transmission of data modulated signals.

In another preferred form, the invention relates to the filters and/or matching circuits connected between the amplifier and load and their ability to pass modulated signals.

In another preferred form, the invention relates to radio transmitters and the transmission of data modulated radio signal.

In yet another form, the Invention relates to the filters and/or matching circuits used between the transmitter's power amplifier and antenna and their ability to pass modulated signals The present invention relates to an improvement on the data transmission method and apparatus disclosed in co-pending applications based on PCT/AU98/01077, the disclosure of which is herein incorporated by reference.

The present invention provides, in one aspect of the invention, for an improved response of a frequency selective circuit to a phase modulated signal by adjusting, over a predetermined period of time, the circuit's centre frequency to substantially adjust to the instantaneous frequency of the phase modulated signal.

Preferably, the predetermined period of time is a less than half a bit period. In one embodiment, the period of time is 1/10th of a bit period The present invention provides, in one aspect of the invention, a device adapted to transmit phase modulated signals, the device comprising a variable tuning circuit connected to a tuned circuit where the variable tuning circuit adjusts the circuits' tuning to substantially match the instantaneous frequency of the phase modulated signal.

Preferably the adjustment results in the phase shift of the circuit being substantially similar with the phase shift of the phase modulated signal.

Preferably, the tuned frequency of the circuit is changed to substantially accommodate one or more changes in the instantaneous frequency of the phase modulated signal.

The present invention provides, in another aspect of the invention, a device adapted to transmit phase modulated signals, the device comprising a variable impedance circuit connected to a tuned circuit where the variable impedance circuit acts with the tuned circuit reactance such that the tuned circuit is substantially matched at the instantaneous frequency of the phase modulated signal.

The present invention provides, in still another aspect of the invention, a device adapted to transmit Phase Jitter Modulation, the device comprising a tuned circuit adapted to operate at a resonant frequency Fo, a variable reactance element such as disclosed in European patent disclosure 0608966 and/or Canadian patent disclosure 1340489 being adapted to adjust the circuits' tuning to substantially match the instantaneous frequency of the PJM signal.

The present invention provides, in an aspect of the invention, a device adapted to transmit Phase Jitter Modulation, the device comprising a tuned circuit adapted to operate at a resonant frequency Fo, a variable reactance element such as disclosed in European patent disclosure 0608966 and/or Canadian patent disclosure 1340489 being adapted to act with the tuned circuit reactance such that the tuned circuits' impedance is substantially matched to the instantaneous frequency of the PJM signal.

The present invention provides, in one aspect of invention, a device adapted to transmit Phase Jitter Modulation, the device comprising a tuned circuit adapted to operate at a resonant frequency Fo, a first switch associated with a first element of the tuned circuit and being adapted to enable the tuned circuit to operate at a resonant frequency Fo−ΔFo, and a second switch associated with a second element of the tuned circuit and being adapted to enable the tuned circuit to operate at a resonant frequency Fo+ΔFo.

Preferably, the first element is a capacitive and/or inductive in nature.

Preferably, the second element is a capacitive and/or inductive in nature.

The present invention also provides, in another aspect of invention, a method of creating a Phase Jitter Modulated signal for transmission, the method comprising providing a tuned circuit having a resonant frequency Fo, providing in association with the tuned circuit, a first switch associated with a first element, providing in association with the tuned circuit, a second switch associated with a second element, and in operation, opening and/or closing the first and/or the second switches to enable the tuned circuit to operate at a resonant frequency between Fo+ΔFo and Fo−ΔFo.

The present invention further provides, in an aspect of invention, a method of configuring a tuned circuit to enable the transmission of PJM signals, the method comprising, in operation, shifting the resonant frequency of the tuned circuit in a manner representative of a data signal to be transmitted.

The present invention further provides, in an aspect of invention, a method of configuring a tuned circuit to enable the transmission of PJM signals, the method comprising, in operation, shifting the impedance of a matching circuit connected to the tuned circuit in a manner representative of a data signal to be transmitted.

The present invention further provides a method that improves Phase Jitter Modulation (PJM) which is a very low deviation phase modulation method ideally suited to RFID. The advantages of PJM are that the excitation field amplitude is constant and the PJM bandwidth is no wider than the original data bandwidth. A full description of PJM is provided in PCT/AU98/01077 (which is incorporated herein by reference). In order to achieve the full benefit of PJM the transmitted PJM signal should have relatively fast phase transition rates. Fast phase transitions can not pass through high Q narrow band antenna circuits. To pass fast phase transitions a wideband antenna response is required.

Other aspects and preferred aspects are disclosed in the specification and/or defined in the claims, forming a part of the description of the invention.

In essence, in the present invention, in order to pass phase modulated signals with relatively high data rates through relatively high Q narrow bandwidth circuits, the centre (resonant) frequency of the circuit is adjusted (shifted) to substantially match the instantaneous frequency of the phase modulated signal in other words, the tuning is 'moved' for relatively short periods of time during the modulated phase transitions. This has been found to result in the ability to get the relatively fast PJM phase transitions into the Interrogator's antenna for transmission to a transponder or other remote device.

The present invention is applicable to various forms of amplifiers where frequency selective circuits, matching circuit, filters or antennas are connected to their output.

The present invention is applicable to various forms of transmitters where frequency selective circuits, matching circuit, filters or antennas are connected to their output.

The present invention is applicable to, but not limited to, various forms of tag(s) and/or interrogator(s). Thus, the nature of the data transmitted according to the present invention is not essential and the tag and/or interrogator whether active and/or passive is not essential to the present invention. A tag may be a transponder. The tag may be an RFID tag.

The present invention has been found to result in a number of advantages, such as:

Enabling the use of fast phase transitions in phase modulated signals

High baud rate or high data rate phase modulated signals can be passed through narrow band circuits High Q, narrow bandwidth high efficiency antenna can be used to transmit high baud rate or high data rate phase modulated signals High baud rate or high data rate PJM can be transmitted from high Q narrow band antennas It will be understood by those skilled in the art that baud rate refers to the modulation "symbols" per second whereas bit rate is the number of bits per second. A modulation symbol (baud) may represent multiple bits and therefore the bit rate may be higher than the baud rate.

Further scope of applicability of the present invention will become apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from this detailed description.

BRIEF DESCRIPTION OF THE DRAWINGS

Further disclosure, objects, advantages and aspects of the present application may be better understood by those skilled in the relevant art by reference to the following description of preferred embodiments taken in conjunction with the accompanying drawings, which are given by way of illustration only, and thus are not limitative of the present invention, and in which:

FIG. 4 illustrates a representation of PJM transmission, FIGS. 5*a* and 5*b* illustrate the relationship of phase and frequency for a the PJM transmission.

DETAILED DESCRIPTION

Figure 1:
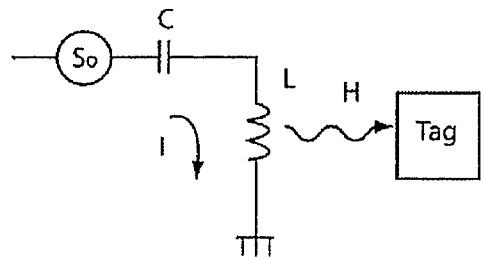
FIG. 1 illustrates a prior art circuit configuration.

FIG. 1 illustrates schematically a circuit configuration associated with prior art excitation of tags. A signal source So provides a signal to a tuned coil (L,C) by virtue of current I, which in turn induces an excitation field H to be transmitted to a tag. The excitation field may include power and/or data.

Figure 2:
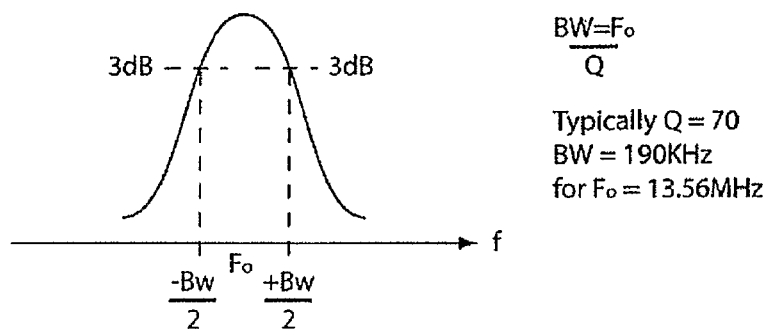
FIG. 2 illustrates a representation of the bandwidth associated with the circuit of FIG. 1.

FIG. 2 illustrates the bandwidth of the prior art circuit shown in FIG. 1 having a resonant frequency Fo, and a 3 dB bandwidth of BW (−BW/2 to +BW/2). In a typical application of the prior art technology, there is a bandwidth approximately 190 kHz (±80 kHz). This equates to an antenna having a Q factor of around 70, using the equation:

$$Q = Fo/\text{Bandwidth} \qquad \text{equation 1}$$

In accordance with the present invention, it has been realised that when an antenna is used of powering a remote tag, an antenna having a relatively high Q factor, provides a relatively high efficiency. However, a relatively high Q factor in turn provides a relatively low bandwidth, as is illustrated in FIGS. 1 and 2.

The inventors have realised that there is a need for a circuit configuration and method of operation which will accommodate the transmission of high data rate phase modulated signals and in particular PJM transmission (see PCT/AU98/01077). PJM transmission is considered, in one embodiment, effective at a high transmission rate, which requires a broader bandwidth and thus is not suited to an efficient antenna having a high Q factor and low bandwidth.

Figure 3:
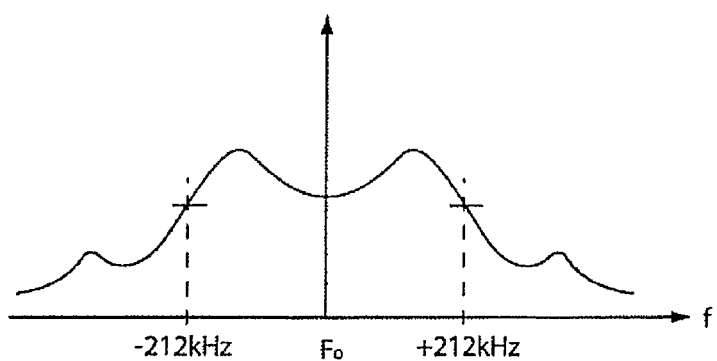
FIG. 3 illustrates a representation of the signal bandwidth associated with a circuit according to one aspect of the present invention.

In one embodiment of PJM, operation has been found to be effective at baud rates up to 10% of the carrier frequency, and most preferably in the range ±2.5% of the carrier frequency. For example International Standards ISO18000-3 Mode 2 requires binary PJM to be at a rate of 424 kbit/sec which requires a bandwidth of at least 424 kHz (−212 kHz to +212 kHz) for a carrier frequency of 13.56 MHz. This is illustrated in FIG. 3. At this frequency (Fo=13.56 MHz) and bandwidth of 424 kHz provides a Q factor of around 17, according to equation 1 above.

In using PJM transmission, the data signal is represented as a phase modulation which appears as a relatively small phase jitter in the excitation field transmitted to the tag, for example. FIG. 4 illustrates a representation of this PJM transmission. An excitation signal 40 has a frequency Fo shown by numeral 41. The jitter caused by the modulated data is represented as a shift in the sideband frequency between numeral 43 (Fo−ΔFo) and another sideband frequency represented by numeral 42 (Fo+ΔFo). The values of (Fo−ΔFo) and (Fo+ΔFo) are derives from the period of the waveform.

It is well known that a time varying sinusoid has an instantaneous angular phase $\theta_c(t)$ where:

$$\theta_c(t) = 2 \cdot \pi \cdot f_c \cdot t + \phi(t) \qquad \text{equation 2}$$

$f_c$ being the carrier frequency and $\phi(t)$ is a phase modulation function. The angular frequency is the time derivative of the angular phase position. Therefore the instantaneous frequency deviation can be defined as:

$$f(t) = (1/2\pi) \cdot (d\phi(t)/dt) \qquad \text{equation 3}$$

which is interpreted as the frequency deviation with respect to $f_c$.

FIG. 5*a* illustrates the phase deviation during a phase modulated baud or bit involving a phase change of 2θ. For a typical PJM signal θ is about 1°. In any system there are frequency limiting circuits which also inherently limit the maximum rate of change for phase modulations and therefore there will be a phase transition time ΔT during which time the phase changes from −θ° to +θ° as shown in FIG. 5*a*. Equation 3 above shows us how the phase transition shown in FIG. 5*a* can be interpreted as the frequency deviation of the carrier shown in FIG. 5*b* where the constantly increasing phase change shown in 51 of FIG. 5*a* can be interpreted as an increase of $\Delta f_c$ in the instantaneous carrier frequency $f_c$ as shown in FIG. 5*b* where for θ in radians $$\Delta f_c = (1/\pi) \cdot (\theta/\Delta T) \qquad \text{equation 4}$$

Alternatively where θ is in degrees $$\Delta f_c = (1/180) \cdot (\theta/\Delta T) \qquad \text{equation 5}$$

And the constantly decreasing phase 53 is interpreted as a decrease of negative $\Delta f_c$ in the instantaneous carrier frequency $f_c$ shown in FIG. 5*b*. For typical values of θ=1° and ΔT=400 ns the value of $\Delta f_c$ is 13.9 kHz.

Figure 6:
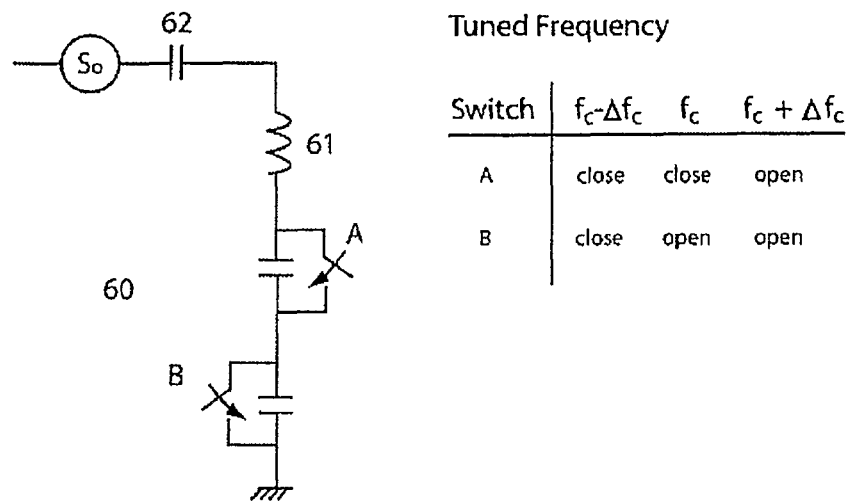
FIG. 6 illustrates one embodiment of the present invention.

FIG. 6 illustrates one embodiment of the present invention, in the form of a tuned coil which can be adapted for the transmission of signals to a tag (not shown). The tuned coil 60 comprises capacitive elements and inductive elements. The inductive element, for example is a coil 61. There are at least capacitive elements, namely primary capacitor 62, a first switchable capacitor A and a second switchable capacitor B.

Figure 7A:
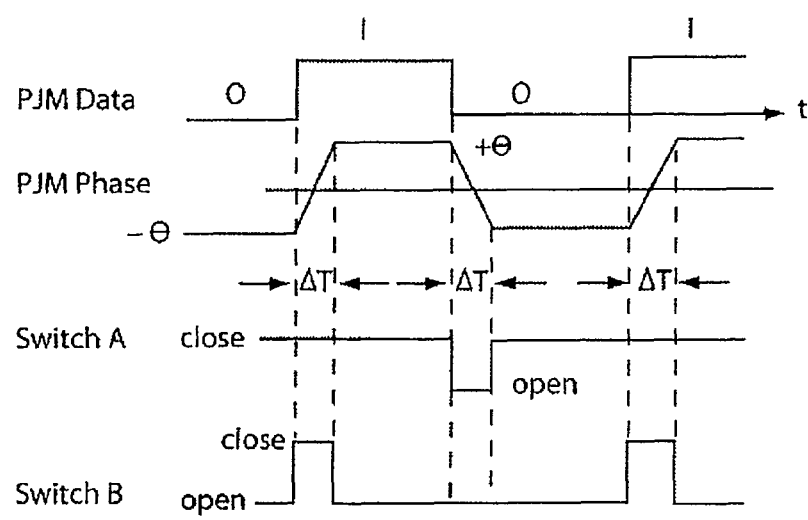
FIG. 7*a* illustrates an example of the operation of the circuit of FIG. 6.
Figure 7B:
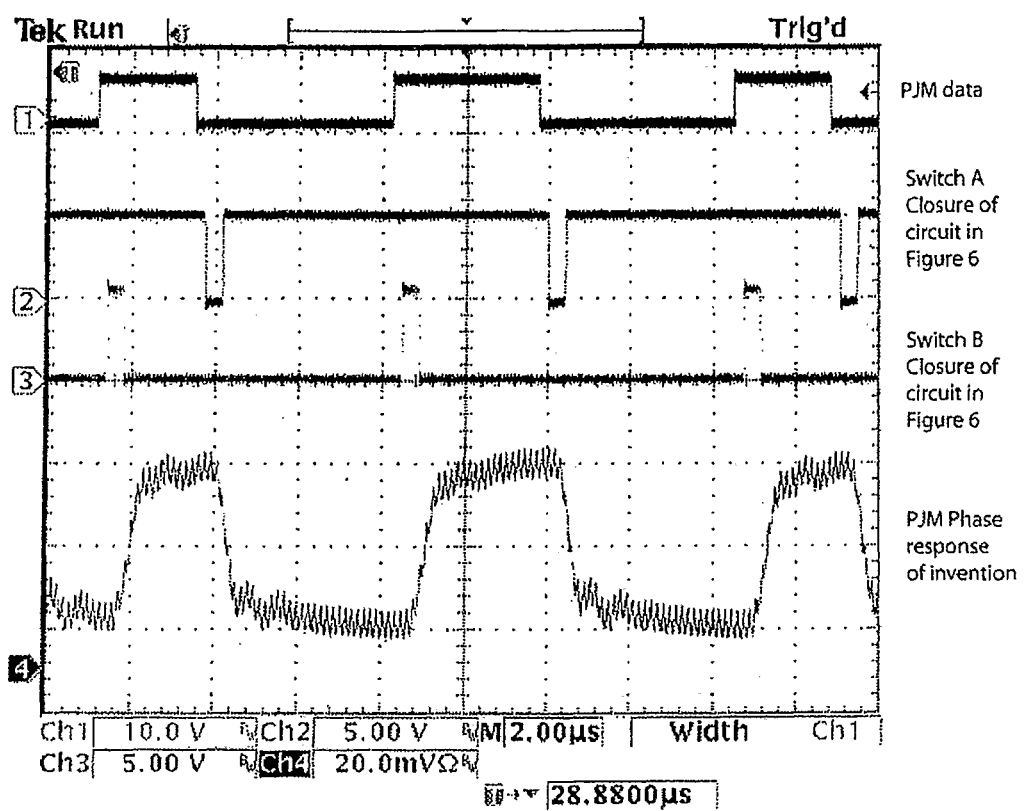
FIG. 7*b* shows actual waveforms associated with the circuit of FIG. 6.
Figure 7C:
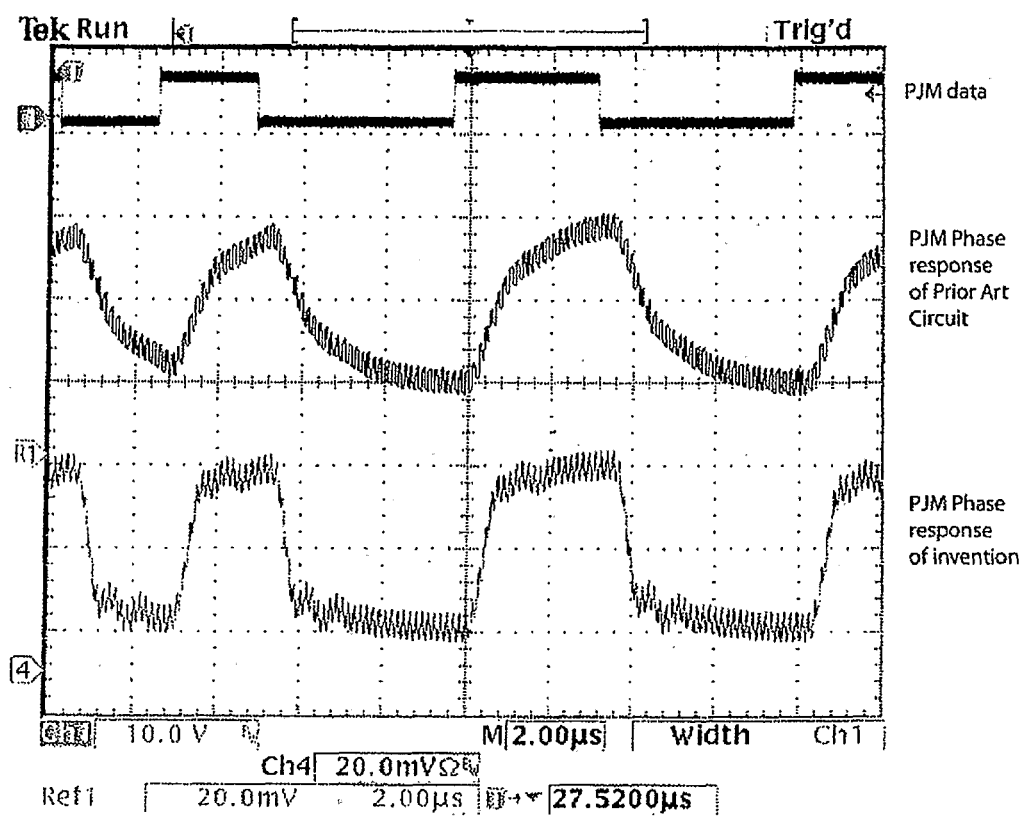
FIG. 7*c* shows actual waveforms associated with the prior art and the circuit of FIG. 6.

In operation, as illustrated in FIG. 7, the switchable capacitors are individually either 'placed in circuit' by for example opening the switch, or they are 'placed out of the circuit', for example by shorting the capacitor or closing the switch. As the switchable capacitors A and/or B are switched 'in' or 'out' of circuit, the resonant frequency of the tuned circuit 60 is changed. For example, the frequency is:

Fo−ΔFo—switch A closed, switch B closed,

Fo—switch A closed, switch B open, and

Fo+ΔFo—switch A open, switch B open.

FIG. 7(*b*) shows actual waveforms associated with the circuit of FIG. 6.

FIG. 7(*c*) shows actual waveforms associated with the prior art and the circuit of FIG. 6.

These frequency changes can be created by or received as PJM data, as represented in the diagram. In operation a PJM modulated carrier signal is provided to the circuit shown in FIG. 6 and the switches A and B are opened and closed such that the instantaneous frequency of the tuned circuit tracks the instantaneous frequency of the PJM signal.

Figure 8:
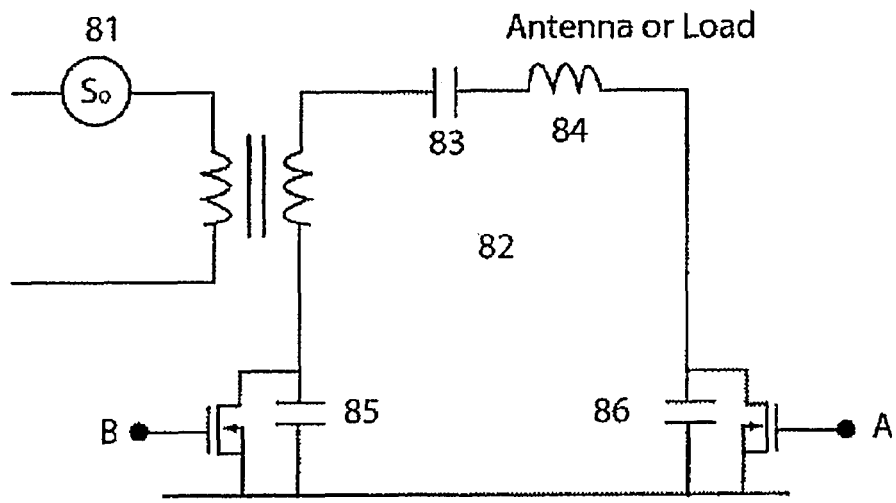
FIG. 8 illustrates another embodiment of the present invention, where the switches share a common reference voltage.

FIG. 8 illustrates another embodiment of the present invention. A signal source 81 provides a PJM modulated carrier signal to a transmitter, in the form of a tuned circuit 82. The tuned circuit has a primary capacitor 83 and an inductance 84, as well as switchable capacitors 85 and 86, fed by data signals B and A respectively. In operation, the circuit of FIG. 8 has a resonant frequency Fo, by virtue of the tuned circuit components 83, 84 and switchable capacitors 85 and 86. The signal Fo may also provide a powering signal to a tag if the tag is passive. Data signal(s) may be applied to switchable capacitors 85 and 86 in order to shift the resonant frequency of the tuned circuit to substantially follow the instantaneous frequency of the PJM modulated carrier signal by virtue of the data applied to switches A and B and as described above with reference to FIG. 7. The capacitors 85 and 86 could alternatively be replaced by inductors or a combination of inductors and capacitors and represent generic reactive elements where reactive impedances are switched by the switches to shift the resonant frequency as required by the PJM signal.

Figure 9:
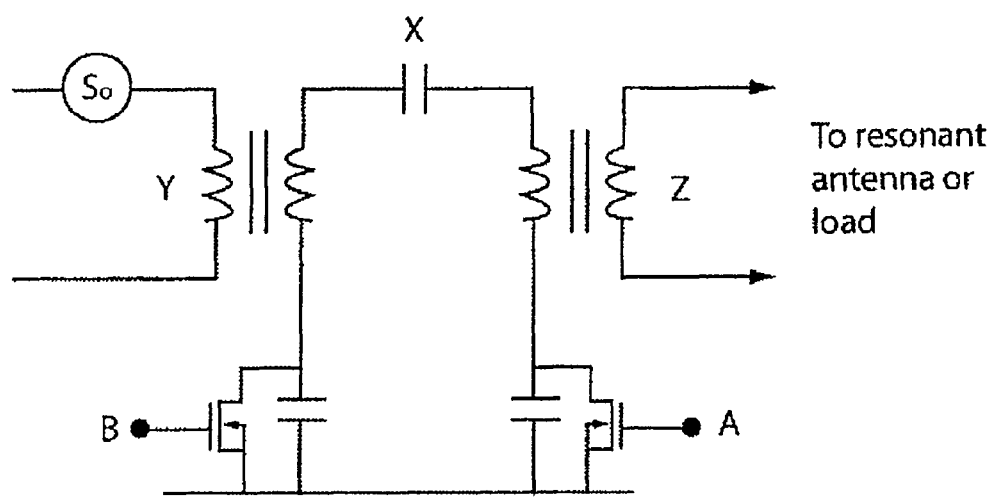
FIG. 9 illustrates still another embodiment of the present invention, where the switches are relatively DC isolated from an antenna or load.
Figure 10A:
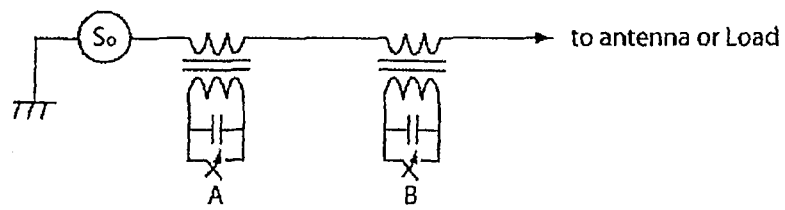
FIGS. 10*a*, 10*b*, 10*c* and 10*d* illustrate a further embodiment of the present invention, where the switches are isolated via one or more transformers.
Figure 10B:
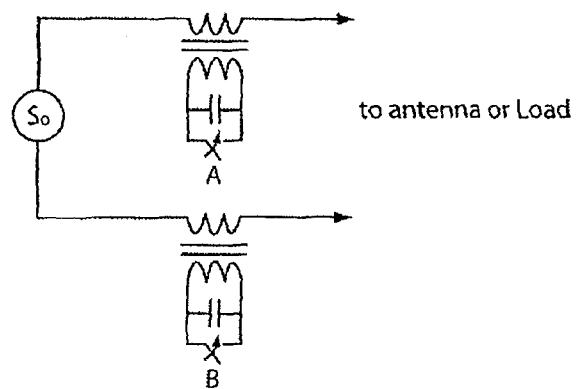
Figure 10C:
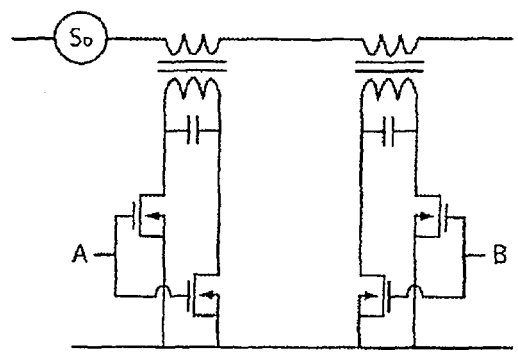
Figure 10D:
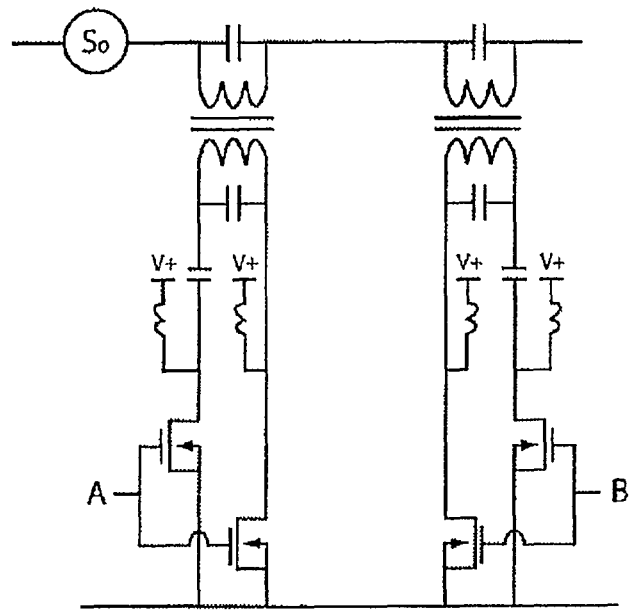

FIG. 9 shows another embodiment of the invention where the switched capacitors (or inductors or combinations of inductors and capacitors) are isolated from a direct connection to the resonant antenna or load circuit by transformers. Capacitor X is included to cancel the leakage inductance of the transformers Y and Z. The circuit shown in FIG. 9 is particularly advantageous where the output resonant antenna is balanced or must be DC isolated from the switches A or B.

FIGS. 10*a*, 10*b*, 10*c* and 10*d* show alternative embodiments where the switches A and B are isolated through individual transformers. These transformers can be connected as a single ended circuit shown in FIGS. 10*a*, 10*c* and 10*d* or a balanced circuit shown in FIG. 10*b*.

Figure 11:
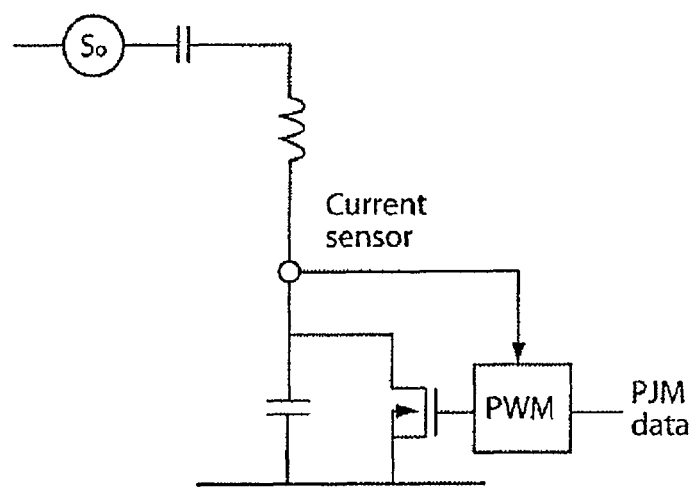
FIG. 11 illustrates a further embodiment of the present invention, where the switch operation corresponds to a portion of the duty cycle

FIG. 11 shows an alternative embodiment where the switchable impedance element is realised by a variable duty cycle switch across a single impedance element. A capacitor is shown in FIG. 11 however an inductor or a combination of inductors and capacitors could be used. The details of this type of circuit are disclosed in European patent disclosure 0608966 and/or Canadian patent disclosure 1340489.

Although the Figures illustrate a capacitor which is switched, an inductance, capacitance and/or any other reactive element(s) may be switched in order to create the effect of moving the resonant frequency of the tuned circuit.

The circuits shown in FIGS. 6, 8, 9, 10 and 11 can be used to match the impedance of an antenna or load circuit such that they are substantially correctly matched at the instantaneous frequency of a PJM carrier being delivered to the antenna or load. For example the tuned circuit shown in the above embodiments may be replaced by a frequency selective load such as a transmission line or a DC rectified load.

It will be appreciated that the invention can be used for multi-level signalling. The embodiments shown can be extended to be used with multi-level phase modulation. Equations 4 or 5 show that the parameters $\Delta f_c$, $\theta$ and $\Delta T$ are related and changes in $\theta$ introduced by multi-level signalling can be accommodated by changes in $\Delta f_c$ or $\Delta T$.

Figure 12A:
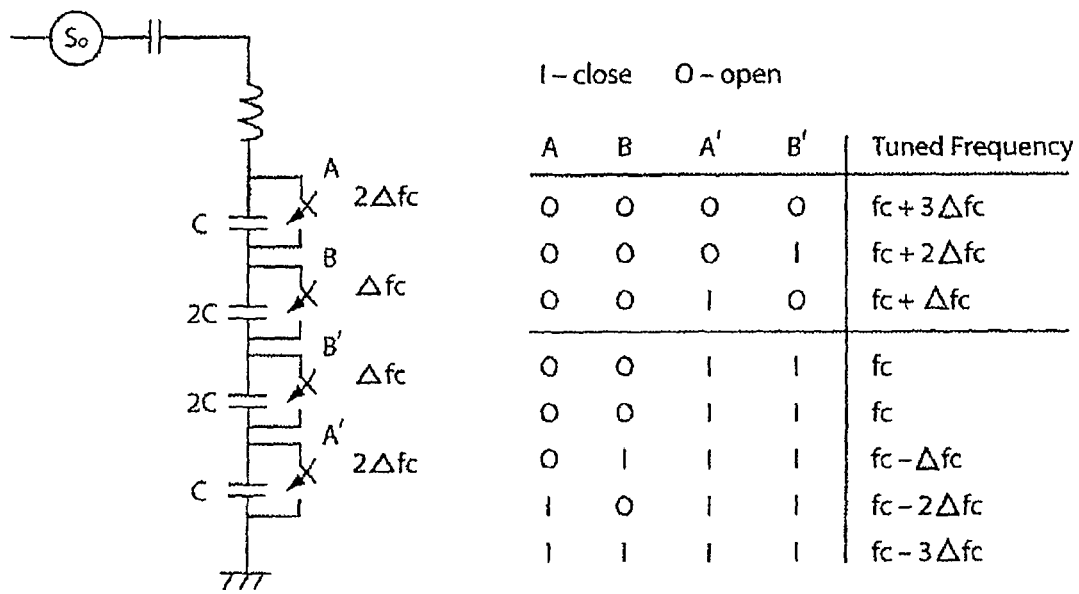
FIG. 12*a* illustrates an embodiment of the present invention adapted for multi-level phase signalling
Figure 12B:
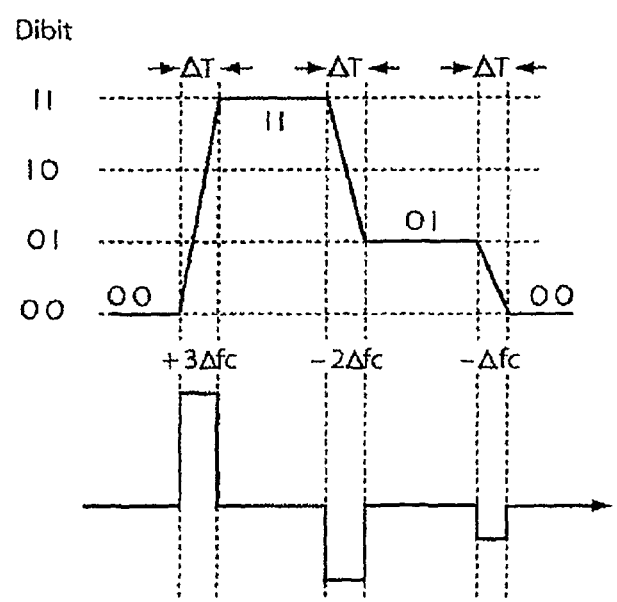
FIG. 12*b* illustrates waveforms associated with FIG. 12*a*

The circuits shown in FIGS. 6, 8, 9, 10 and 11 can be extended to have different values of $\Delta f_c$ for the different values of $\theta$ associated with different level signalling. The circuits shown in FIGS. 6, 8, 9 and 10 can include additional switched reactance's which could be switched in groups to give the different frequency shifts required for the extra modulation levels. The circuit shown in FIG. 11 can have a larger change in the variable duty cycle. These are shown in FIGS. 12*a* and 12*b*.

Figure 13A:
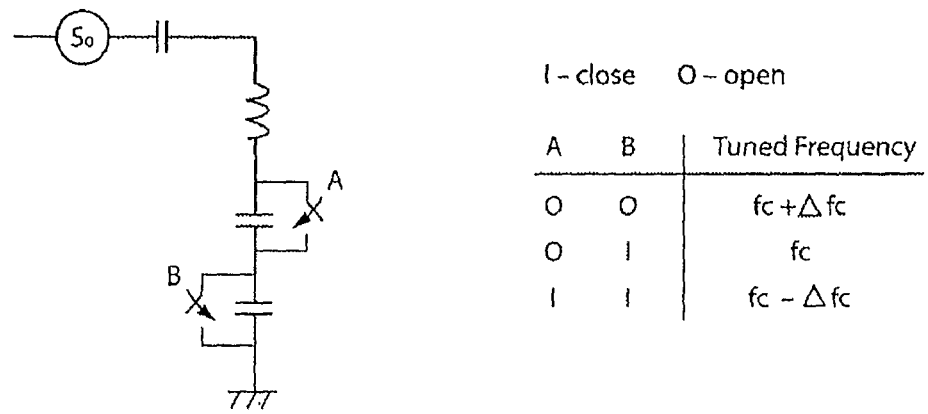
FIG. 13*a* illustrates a further embodiment of the present invention adapted for multi-level phase signalling.
Figure 13B:
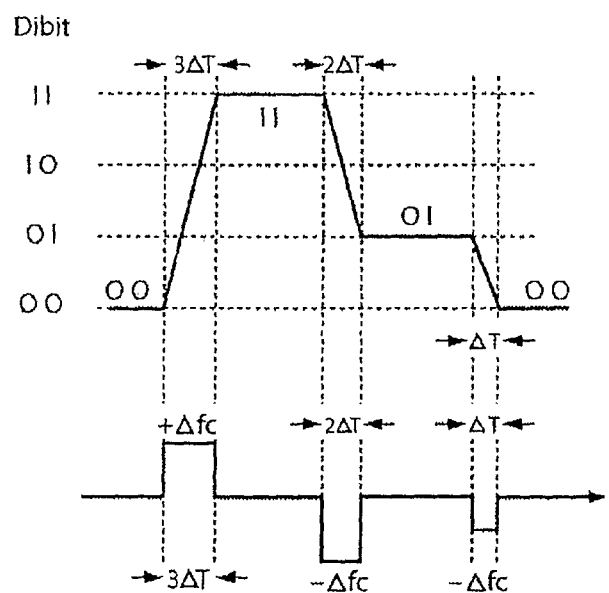
FIG. 13*b* illustrates waveforms associated with FIG. 13*a*.

Alternatively the circuits shown in FIGS. 6, 8, 9, 10 and 11 can be extended to have different values of $\Delta T$ for the different values of $\theta$. The circuits shown in FIGS. 6, 8, 9 and 10 can have the switched reactance's held for a longer $\Delta T$ to give the different phase shifts required for the extra modulation levels. The circuit shown in FIG. 11 can have the change in the variable duty cycle extended for a longer $\Delta T$ to give the different phase shifts required for the extra modulation levels. These are shown in FIGS. 13*a* and 13*b*.

While this invention has been described in connection with specific embodiments thereof, it will be understood that it is capable of further modification(s). This application is intended to cover any variations uses or adaptations of the invention following in general, the principles of the invention and including such departures from, the present disclosure as come within known or customary practice within the art to which the invention pertains and as may be applied to the essential features hereinbefore set forth.

As the present invention may be embodied in several forms without departing from the spirit of the essential characteristics of the invention, it should be understood that the above described embodiments are not to limit the present invention unless otherwise specified, but rather should be construed broadly within the spirit and scope of the invention as defined in the appended claims. Various modifications and equivalent arrangements are intended to be included within the spirit and scope of the invention and appended claims. Therefore, the specific embodiments are to be understood to be illustrative of the many ways in which the principles of the present invention may be practiced. In the following claims, means-plus-function clauses are intended to cover structures as performing the defined function and not only structural equivalents, but also equivalent structures. For example, although a nail and a screw may not be structural equivalents in that a nail employs a cylindrical surface to secure wooden parts together, whereas a screw employs a helical surface to secure wooden parts together, in the environment of fastening wooden parts, a nail and a screw are equivalent structures.

"Comprises/comprising" when used in this specification is taken to specify the presence of stated features, integers, steps or components but does not preclude the presence or addition of one or more other features, integers, steps, components or groups thereof. Thus, unless the context clearly requires otherwise, throughout the description and the claims, the words 'comprise', 'comprising', and the like are to be construed in an inclusive sense as opposed to an exclusive or exhaustive sense; that is to say, in the sense of "including, but not limited to".

The claims defining the invention are as follows:

1. A method of configuring a transmitter in order to transmit a Phase Jitter Modulated (PJM) signal, the method comprising:

adjusting, at a predetermined period of time corresponding to a change of phase of the PJM signal, transmitter frequency to substantially match, within predetermined limits, an instantaneous frequency of the PJM signal; and wherein said adjusting is performed by varying at least one reactance element of the transmitter.

2. The method as claimed in claim 1, wherein the predetermined period of time is less than half a bit period.

3. The method as claimed in claim 1, wherein the predetermined period of time is 1/10th of a bit period.

4. The method as claimed in claim 1, wherein the adjustment is in accordance with $f(t)=(1/2\pi)(d\Phi(t)/dt)$, where $\Phi(t)$ is a phase modulation function.

5. The method as claimed in claim 1, wherein the adjustment is in accordance with $\Delta f_c=(1/\pi)(\theta/\Delta T)$;
where $\Delta f_c$ in an instantaneous carrier frequency; and
where $\Delta T$ is a phase transition time.

6. The method as claimed in claim 1, wherein the adjustment is in accordance with $\Delta f_c=(1/180)(\theta/\Delta T)$;
where $\Delta f_c$ in an instantaneous carrier frequency; and
where $\Delta T$ is a phase transition time.

7. A device adapted to transmit a Phase Jitter Modulated (PJM) signal, the device comprising:
a variable tuning circuit adapted to adjust, at a period of time corresponding to a change of phase of the PJM signal, a transmitter frequency of a tuned circuit to substantially match, within predetermined limits, an instantaneous frequency of the PJM signal; and
wherein said adjustment is performed by varying at least one reactance element of the tuning circuit.

8. The device as claimed in claim 7, wherein a tuned frequency of the circuit is changed to substantially accommodate one or more changes in the instantaneous frequency of the phase jitter modulated signal.

9. The device as claimed in claim 7, wherein $\Delta Fo$ is in accordance with $f(t)=(1/2\pi)(d\Phi(t)/dt)$, where $\Phi(t)$ is a phase modulation function.

10. A method of configuring a tuned circuit to enable transmission of Phase Jitter Modulated (PJM) signals, the method comprising:
adjusting, at a period of time corresponding to a change of phase of the PJM signals, a transmitter frequency of the tuned circuit to substantially match, within predetermined limits, an instantaneous frequency of the PJM signals; and
wherein said adjusting is performed by varying at least one reactance element of the tuned circuit.

11. A device comprising:
a transmitter, wherein the device is adapted to configure the transmitter to transmit and receive Phase Jitter Modulation (PJM) signals;
wherein, at a period of time corresponding to a change of phase of the PJM signals, a frequency of the transmitter is adjusted to substantially match, within predetermined limits, an instantaneous frequency of the PJM signals; and wherein said adjustment is performed by varying at least one reactance element of the transmitter.

12. A device adapted to transmit Phase Jitter Modulation (PJM) signals, the device comprising:
a tuned circuit adapted to operate at a resonant frequency Fo;
a first switch associated with a first reactance element of the tuned circuit and being adapted to enable the tuned circuit to operate at a resonant frequency Fo−ΔFo;
a second switch associated with a second reactance element of the tuned circuit and being adapted to enable the tuned circuit to operate at a resonant frequency Fo+ΔFo;
wherein, at a period of time corresponding to a change of phase of the PJM signals, an instantaneous transmitter frequency of the tuned circuit is adjusted to substantially match, within predetermined limits, an instantaneous frequency of the PJM signals; and
wherein said adjustment is performed by varying at least one the first reactance element and the second reactance element of the tuned circuit.

13. The device as claimed in claim 12, wherein the first reactance element is a capacitive and/or inductive in nature.

14. The device as claimed in claim 12, wherein the second reactance element is a capacitive and/or inductive in nature.

15. The device as claimed in claim 12, wherein the first and/or second switchable reactance elements comprise at least one semiconductor switch.

16. The device as claimed in claim 12, wherein the first and/or second switchable reactance elements comprise at least one MOSFET.

17. The device as claimed in claim 12, wherein $\Delta Fo$ is in accordance with $f(t)=(1/2\pi)(d\Phi(t)/dt)$, where $\Phi(t)$ is a phase modulation function.

18. The device as claimed in claim 7, wherein $\Delta Fo$ is in accordance with $\Delta f_c=(1/\pi)(\theta/\Delta T)$;
where $\Delta f_c$ in an instantaneous carrier frequency; and
where $\Delta T$ is a phase transition time.

19. The device as claimed in claim 7, wherein $\Delta Fo$ is in accordance with $\Delta f_c=(1/180)(\theta/\Delta T)$;
where $\Delta f_c$ in an instantaneous carrier frequency; and
where $\Delta T$ is a phase transition time.

20. The device as claimed in claim 12, wherein $\Delta Fo$ is in accordance with $\Delta f_c=(1/\pi)(\theta/\Delta T)$;
where $\Delta f_c$ in an instantaneous carrier frequency; and
where $\Delta T$ is a phase transition time.

21. The device as claimed in claim 12, wherein $\Delta Fo$ is in accordance with $\Delta f_c=(1/180)(\theta/\Delta T)$;
where $\Delta f_c$ in an instantaneous carrier frequency; and
where $\Delta T$ is a phase transition time.

* * * * *

UNITED STATES PATENT AND TRADEMARK OFFICE
CERTIFICATE OF CORRECTION

PATENT NO. : 8,417,195 B2  
APPLICATION NO. : 12/066355  
DATED : April 9, 2013  
INVENTOR(S) : Graham Alexander Munro Murdoch Page 1 of 1

It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 695 days.

Signed and Sealed this  
Sixteenth Day of July, 2013

Teresa Stanek Rea  
*Acting Director of the United States Patent and Trademark Office*

UNITED STATES PATENT AND TRADEMARK OFFICE
CERTIFICATE OF CORRECTION

PATENT NO. : 8,417,195 B2
APPLICATION NO. : 12/066355
DATED : April 9, 2013
INVENTOR(S) : Graham Alexander Munro Murdoch It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 1108 days.

Signed and Sealed this
First Day of September, 2015

Michelle K. Lee
*Director of the United States Patent and Trademark Office*